United States Patent [19]

May

[11] Patent Number: 5,195,009

[45] Date of Patent: Mar. 16, 1993

[54] CURRENT SUMMING ARRANGEMENT FOR GROUND FAULT DETECTION

[75] Inventor: William E. May, Lawrenceville, Ga.

[73] Assignee: Siemens Energy & Automation, Inc., Alpharetta, Ga.

[21] Appl. No.: 750,353

[22] Filed: Aug. 27, 1991

[51] Int. Cl.⁵ .................. H02H 3/16; H02H 3/347
[52] U.S. Cl. ................................................ 361/44
[58] Field of Search ............... 324/509, 510; 361/42, 361/44, 45, 46, 47, 48, 49, 50

[56] References Cited

U.S. PATENT DOCUMENTS

| | | | |
|---|---|---|---|
| 3,786,311 | 1/1974 | Hobson, Jr. et al. | 361/44 |
| 3,887,867 | 6/1975 | Safer et al. | 324/51 |
| 4,121,269 | 10/1978 | Hobson, Jr. | 361/44 |
| 4,234,900 | 11/1980 | Miyazaki et al. | 361/45 |
| 4,258,403 | 3/1981 | Shimp | 361/42 |
| 4,380,785 | 4/1983 | Demeyer et al. | 361/44 |
| 4,443,828 | 4/1984 | Legrand et al. | 361/44 |
| 4,631,625 | 12/1986 | Alexander et al. | 361/94 |
| 4,758,919 | 7/1988 | Stewart | 361/63 |
| 4,761,704 | 8/1988 | Fraisse et al. | 361/50 |
| 4,853,819 | 8/1989 | Suwa et al. | 361/47 |
| 4,939,615 | 7/1990 | Brant et al. | 361/42 |
| 4,947,126 | 8/1990 | May et al. | 324/509 |
| 5,095,398 | 3/1992 | Winter et al. | 361/42 |

Primary Examiner—A. D. Pellinen
Assistant Examiner—Ronald W. Leja

[57] ABSTRACT

An arrangement for producing a signal representative of the vectorial sum of the currents in a plurality of electric conductors in an electrical system. The arrangement includes a current transformer associated with each of the electrical conductors, and a differential current transformer for summing the current produced by each of the current transformers in response to currents in the electrical conductors. The differential current transformer is coupled to a rectifier and resistor arrangement which allows a voltage signal to be produced which is representative of the sum of the currents in the current transformers. The voltage signal is also representative of the sum of currents in the phase conductors of the electrical system.

13 Claims, 2 Drawing Sheets

CURRENT SUMMING ARRANGEMENT FOR GROUND FAULT DETECTION

FIELD OF THE INVENTION

The present invention relates to the detection of ground fault conditions. More particularly, the present invention relates to a ground fault detection circuit in an arrangement for use with electrical apparatus such as electronic trip units and circuit breakers.

BACKGROUND OF THE INVENTION

A number of different arrangements exist for detecting ground faults in electrical systems. By way of example, U.S. Pat. No. 4,947,126, issued on Aug. 7, 1990 to William E. May, William A. King, and Jerry M. Green, discloses a current measuring circuit which retains the polarity information of signals representative of currents being measured after full wave rectification of the signal. The signal and polarity information may be used to determine whether a ground fault condition exists within the electrical system providing the current.

In one embodiment of the measuring circuit, as applied to a three-phase system, a current transformer associated with each of the phases, including the neutral phase, is used to provide signals representative of the currents in the three phases and the neutral. To determine whether a ground fault condition exists in the system, appropriate circuitry must be provided to condition and properly sum the signals from the current transformers to ensure that a ground fault signal is produced when a ground fault condition exists in the system. In particular, the circuit may retain all of the phase information from the current transformers for the purpose of summing the signals.

In light of the prior art, it would be advantageous to provide a method and arrangement for simplifying the process of vectorially summing the signals which represent the currents in the phases and neutral of a system for the purpose of producing a signal representative of the level of ground fault in a system.

SUMMARY OF THE INVENTION

The present invention provides an arrangement for producing a signal representative of the sum of signals representative of electrical currents in an electrical power system of the type including at least a first electrical conductor and a second electrical conductor. The arrangement includes first means, linkable by magnetic flux to the first electrical conductor, for producing a first magnetic field representative of a first current in the first electrical conductor, and second means, linkable by magnetic flux to the second electrical conductor, for producing a second magnetic field representative of a second current in the second electrical conductor. A signal means produces a signal representative of the sum of the first and second magnetic fields, where the first and second magnetic fields induce a signal current in the signal means representative of the sum of the first and second magnetic fields.

The present invention further provides an arrangement for producing a signal representative of the signals representative of the currents in an electrical power system of the type including at least a first electrical conductor and a second electrical conductor. The arrangement includes a first winding disposed about the first electrical conductor to produce a first current in the first winding, and a second winding disposed about the second electrical conductor to produce a second current in the second winding. The first current is representative of a current in the first electrical conductor and the second current is representative of a current in the second electrical conductor. A third winding is disposed about one conductor of each of the first and second windings to produce a third current in the third winding representative of the sum of the currents in the first and second electrical conductors.

The present invention further provides an arrangement for summing signals representative of the currents in first, second, third and neutral phase conductors. The arrangement includes first, second, third and neutral windings disposed about the first, second, third and neutral phase conductors respectively, to produce first, second, third and neutral currents in the first, second, third and neutral windings respectively. The first, second, third and neutral currents are representative of currents in the first, second, third and neutral phase conductors. A secondary winding is disposed about at least one conductor of each of the first, second, third and neutral windings to produce a vectorial sum current in the secondary winding representative of the sum of the currents in the first, second, third and neutral phase conductors.

The present invention still further provides an arrangement for producing a signal representative of the sum of currents in the electrical conductors of an electrical power system of the type including at least a first electrical conductor and a second electrical conductor. The arrangement includes first means, linkable by magnetic flux to the first electrical conductor and including a first conductor, for producing a first current in the first conductor representative of a first phase current in the first electrical conductor, and second means, linkable by magnetic flux to the second electrical conductor and including a second conductor, for producing a second current in the second conductor representative of a second phase current in the second electrical conductor. The arrangement also includes a circuit board including a plurality of leads and a winding including a housing disposed about the winding. The housing supports the winding upon the circuit board, where first and second conductive pins are disposed to engage and locate the housing upon the circuit board such that the winding is disposed about the pins. The pins also couple each of the first and second conductors to one of the plurality of leads. The winding produces a third current in the winding representative of the sum of the currents in the first and second electrical conductors.

DETAILED DESCRIPTION OF THE PREFERRED EMBODIMENT

Figure 1:
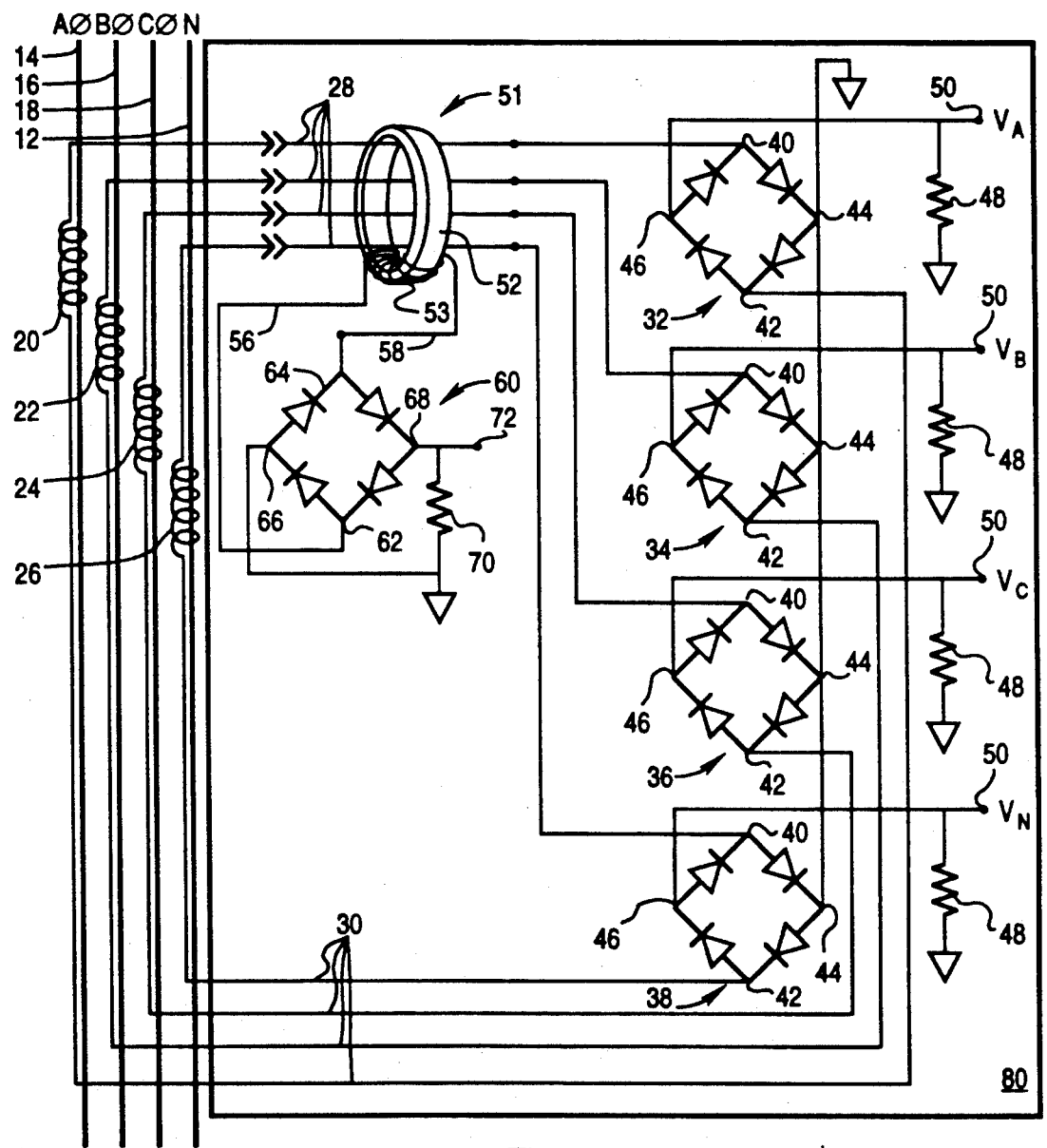
FIG. 1 is a schematic diagram of a circuit arrangement for summing currents.

Referring to FIG. 1, an arrangement 10, for producing a signal representative of the sum of the currents in an electrical system including an A phase conductor 14, a B phase conductor 16, a C phase conductor 18 and a neutral phase conductor 12. Arrangement 10 includes current transformers 20, 22, 24 and 26 disposed about A phase 14, B phase 16, C phase 18, and neutral phase 12, respectively. The secondary windings of each current transformer 20, 22, 24 and 26 are each coupled to a pair of conductors 28 and 30. Conductors 28 and 30 of each current transformer 20, 22, 24 and 26 are connected to full wave rectifiers 32, 34, 36 and 38, respectively. Conductors 28 and 30 are connected to terminals 40 and 42, respectively, of their respective full wave rectifier. Each rectifier 32, 34, 36 and 38 includes a terminal 44 which is grounded and a terminal 46 which is grounded via a suitable resistor 48 and coupled to a signal terminal 50 ($V_A$, $V_B$, $V_C$, $V_N$).

Arrangement 10 also includes a differential current transformer 51 having a secondary winding 53 disposed about a core 52. Core 52 is doughnut shaped and is disposed about conductors 28 of current transformers 20, 22, 24 and 26 such that conductors 28 pass through the center of core 52. Secondary winding 53 is coupled to a pair of conductors 56 and 58 which are connected to a full wave rectifier 60. Conductors 56 and 58 are coupled to terminals 62 and 64, respectively, of full wave rectifier 60. One output terminal 66 of rectifier 60 is connected to ground and another output terminal 68 is connected to ground by a resistor 70 and also connected to a signal terminal 72.

Transformer 51, resistors 48 and 70, and full wave rectifiers 32, 34, 36, 38 and 60 may be mounted upon a circuit board 80. By way of example, full wave rectifiers 32, 34, 36, 38 and 60 may be of the type including diodes arranged as shown in FIG. 1, or any other circuit or component which satisfactorily performs the full wave rectification function for the desired application.

Figure 2:
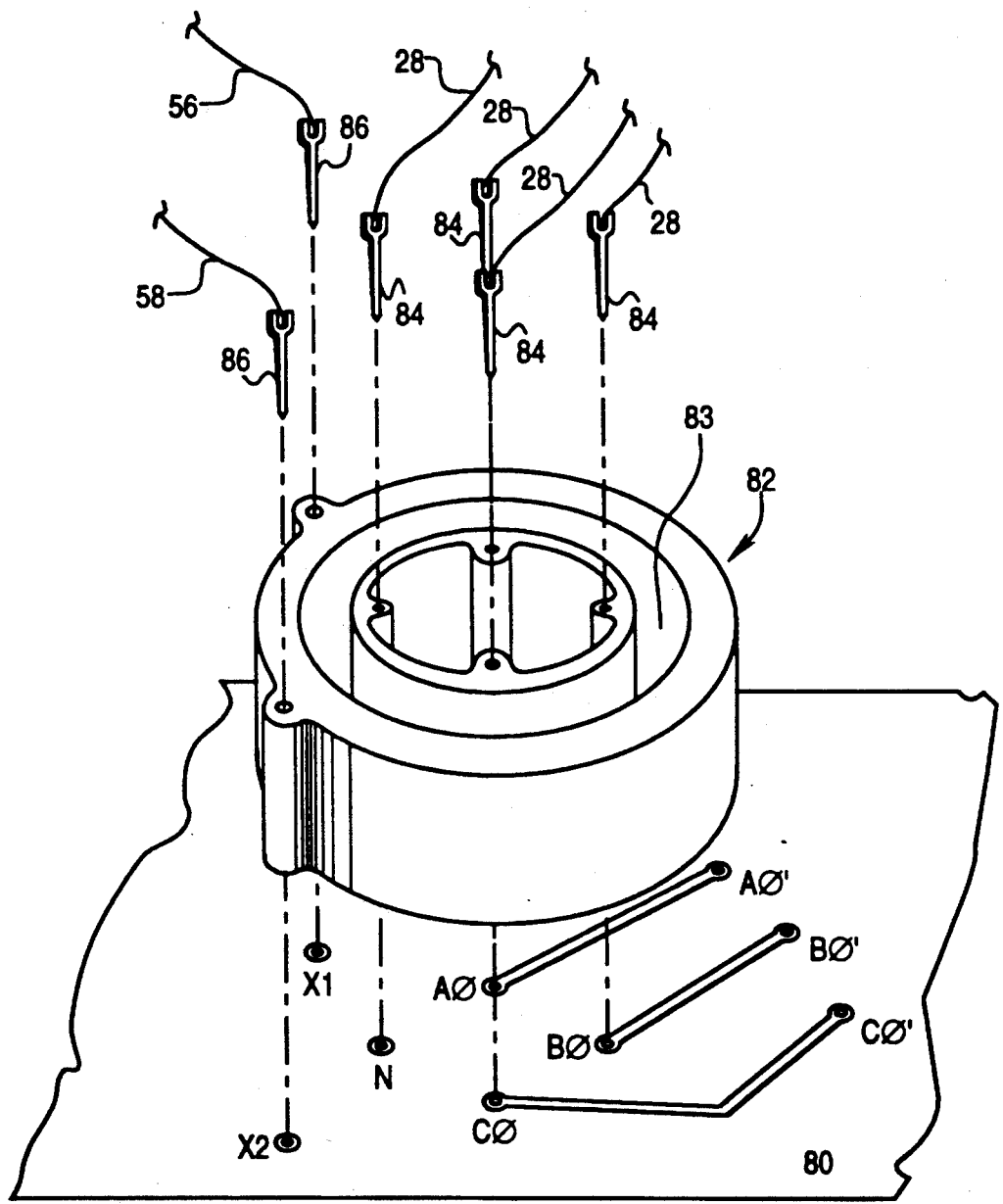
FIG. 2 is a portion of a circuit board for supporting the circuit arrangement.

Referring to FIG. 2, a preferred embodiment of the circuit arrangement upon a portion of circuit board 80 is illustrated. In particular, current transformer 51 (not shown in FIG. 2) includes a substantially annular shaped plastic housing 82 having a shape as shown in FIG. 2, which includes an annular shaped receptacle 83 for accepting and supporting core 52 (not shown in FIG. 2). Housing 82 also includes a plurality of holes for accepting conductive pins 84 and 86. Conductive pins 84 and 86 fasten the housing to circuit board 80. Pins 86 also provide a conductive path from conductor 56 and 58 of winding 53 to rectifier 60 which is coupled to terminals X1 and X2 on the circuit board. Pins 84 provide a conductive path through core 52 from each conductor 28 to respective terminals A$\phi$, B$\phi$, C$\phi$ and N which are appropriately coupled to rectifiers 32, 34, 36 and 38. For purposes of mass production, this arrangement provides a circuit board construction which provides some degree of consistency in the dimensional relationship between core 52 and conductors 28 from board to board. This arrangement allows the circuits to have similar characteristics for purposes of vectorially summing the currents in conductors 28 to provide a signal representative of the sum of currents in phases A, B, C and the neutral phase.

Operation

In general, arrangement 10 will provide a signal at terminal 72 representative of the vectorial sum of currents in A phase 14, B phase 16, C phase 18, and neutral phase 12. A voltage signal of 0 volts at terminal 72 represents a zero (0) vectorial sum of the currents in the phase conductors and, accordingly, that a ground fault condition does not exist. In operation, each of the windings of transformers 20, 22, 24 and 26 are linked by a magnetic flux to phase conductors 14, 16, 18 and neutral conductor 12, respectively. The magnetic linkage allows for a current to be induced in each of transformers 20, 22, 24 and 26 which is, within a range, proportional to the current flowing in each associated conductor 14, 16, 18 and 12. More specifically, the current is related to the number of turns in the windings of transformers 20, 22, 24 and 26, which may be determined based upon the application to which arrangement 10 is applied.

The current is supplied from transformers 20, 22, 24 and 26 via conductors 28 and 30 to the appropriate full wave rectifier 32, 34, 36 and 38, respectively. Full wave rectifiers 32, 34, 36 and 38 rectify the currents to provide voltage signals across resistors 48 at one of terminals 50 representative of the current levels in windings 20, 22, 24 and 26. This arrangement is used in systems where the currents in a three phase system and the associated neutral are monitored. For example, this arrangement may be used with a circuit breaker where a trip circuit monitors the voltages at terminals 50, and determines when there is an adverse condition in the system, such as an overload current or phase imbalance. Of course, an arrangement such as this could be used in less than a three phase system, e.g., a single phase system.

Winding 53 is linked by a magnetic flux to conductors 28 which pass through the center of core 52. Accordingly, a current will be induced in winding 53 when the vectorial sum of the currents in the four conductors 28 does not equal 0 (ground fault condition). This current is provided to full wave rectifier 60, via conductors 56 and 58, which rectifies the current and provides a voltage signal, developed across resistor 70, at terminal 72, which is representative of the vectorial sum of the currents in conductors 28. An appropriate circuit for monitoring the voltage signal at terminal 72 may be provided to monitor this voltage and take an appropriate action when this signal falls outside of a predetermined acceptable range which may be narrow or wide, depending upon the application, e.g., ground fault personnel protection versus equipment protection. By way of example only, the circuit for monitoring the voltages at terminals 50 may be modified to also monitor the voltage at terminal 72 for use in the trip unit of a conventional circuit breaker. The use of differential current transformer 51, as discussed above, may be used in systems other than three phase systems, e.g., single phase systems.

The preferred embodiment of the present invention has been disclosed by way of example and it will be understood that other modifications may occur to those skilled in the art without departing from the scope and spirit of the appended claims.

What is claimed is:

1. In an electrical power system of the type including at least a first electrical conductor and a second electrical conductor, an arrangement for producing a signal representative of the sum of currents in the electrical conductors, the arrangement comprising:

first means, linkable by magnetic flux to the first electrical conductor and including a first conductor, for producing a first current in the first conductor representative of a first phase current in the first electrical conductor;

second means, linkable by magnetic flux to the second electrical conductor and including a second conductor, for producing a second current in the second conductor representative of a second phase current in the second electrical conductor;

a circuit board including a plurality of leads;

a winding;

a housing disposed about the winding, the housing supporting the winding upon the circuit board; and first and second conductive pins disposed to engage the housing and circuit board such that the winding is disposed about the pins, where the first and second conductive pins are disposed to couple each of the first and second conductors to one of the plurality of leads;

wherein a third current is produced in the winding which is representative of the sum of the currents in the first and second electrical conductors.

2. The arrangement of claim 1, further comprising third and fourth pins disposed to engage the housing and the circuit board such that the third and fourth pins are disposed outside of the winding, and couple the winding to two of the plurality of leads.

3. The arrangement of claim 1, where the first means comprises a first secondary winding disposed about the first electrical conductor and the second means comprises a second secondary winding disposed about the second electrical conductor, where electrical currents in the first and second electrical conductors induce secondary currents in the first and second conductors respectively.

4. The arrangement of claim 1, further comprising means for rectifying the third current, and producing a voltage signal representative of the third current.

5. The arrangement of claim 1, wherein the system further comprises means for rectifying the first and second currents, and producing voltage signals representative of the first and second currents.

6. The arrangement of claim 1 wherein the housing comprises a first annular piece disposed within a second annular piece.

7. The arrangement of claim 6 wherein the first and second pieces are plastic.

8. In an electrical power system of the type including at least a first electrical conductor and a second electrical conductor, an arrangement for producing a signal representative of the sum of currents in the electrical conductors, the arrangement comprising:

an annular transformer core;

a first winding including a first winding conductor and magnetically linked to the first electrical conductor to produce a first current in the first winding conductor, where the first current is representative of a current in the first electrical conductor and the first winding conductor passes through the core;

a second winding including a second winding conductor and magnetically linked to the second electrical conductor to produce a second current in the second winding, where the second current is representative of a current in the second electrical conductor and the second winding conductor passes through the core;

a third winding disposed about the core such that a third current is produced in the third winding of the sum of the currents in the first and second electrical conductors; and where the first and second winding conductors each include a conductive pin which passes through the core.

9. The arrangement of claim 8, further comprising means for rectifying the third current, and producing a voltage signal representative of the signal current.

10. The arrangement of claim 8, wherein the system further includes means for rectifying the first and second currents, and producing voltage signals representative of the first and second currents.

11. In an electrical power system of the type including first, second, third and neutral phase conductors, an arrangement for producing a signal representative of the sum of currents in the conductors, the arrangement comprising:

first, second, third and neutral windings including first, second, third and neutral winding conductors, respectively, and magnetically liked to the first, second, third and neutral phase conductors respectively, to produce first, second, third and neutral currents in the winding conductors of the first, second, third and neutral windings respectively, where the first, second, third and neutral current are representative of currents in the first, second, third and neutral phase conductors respectively;

a secondary winding disposed about an annular core which is disposed about a portion of the first, second, third and neutral winding conductors, the secondary winding being disposed to produce a sum current in the secondary winding representative of the sum of the currents in the first, second, third and neutral phase conductors; and where the first, second, third and neutral winding conductors each include a conductive pin which is disposed within the annular core 12. The arrangement of claim 11, further comprising means for rectifying the sum current, and producing a voltage signal representative of the sum current.

13. The arrangement of claim 11, wherein the system further includes means for rectifying the first, second, third and neutral currents, and producing voltage signals representative of the first, second, third and neutral currents.

* * * * *